(12) United States Patent
La Tulipe, Jr. et al.

(10) Patent No.: US 9,190,303 B2
(45) Date of Patent: Nov. 17, 2015

(54) REDUCING WAFER BONDING MISALIGNMENT BY VARYING THERMAL TREATMENT PRIOR TO BONDING

(71) Applicant: INTERNATIONAL BUSINESS MACHINES CORPORATION, Armonk, NY (US)

(72) Inventors: Douglas C. La Tulipe, Jr., Guilderland, NY (US); Wei Lin, Albany, NY (US); Spyridon Skordas, Wappingers Falls, NY (US); Kevin R. Winstel, East Greenbush, NY (US)

(73) Assignee: GLOBALFOUDRIES INC., Grand Cayman (KY)

( * ) Notice: Subject to any disclaimer, the term of this patent is extended or adjusted under 35 U.S.C. 154(b) by 0 days.

(21) Appl. No.: 14/716,236

(22) Filed: May 19, 2015

(65) Prior Publication Data

US 2015/0279709 A1    Oct. 1, 2015

Related U.S. Application Data

(62) Division of application No. 14/019,637, filed on Sep. 6, 2013, now Pat. No. 9,059,039.

(51) Int. Cl.
| | |
|---|---|
| *G01R 31/26* | (2014.01) |
| *G06F 19/00* | (2011.01) |
| *H01L 21/67* | (2006.01) |
| *H01L 23/00* | (2006.01) |
| *H01L 21/324* | (2006.01) |

(52) U.S. Cl.
CPC ........ *H01L 21/67259* (2013.01); *H01L 21/324* (2013.01); *H01L 24/83* (2013.01); *H01L 24/94* (2013.01)

(58) Field of Classification Search
None
See application file for complete search history.

(56) References Cited

U.S. PATENT DOCUMENTS

| | | |
|---|---|---|
| 8,900,885 B1 | 12/2014 | Hubbard et al. |
| 2012/0255365 A1 | 10/2012 | Wimplinger |
| 2013/0207098 A1 | 8/2013 | Yeh et al. |
| 2013/0330165 A1 | 12/2013 | Wimplinger et al. |
| 2014/0226894 A1 | 8/2014 | Wagenleitner |
| 2014/0356981 A1 | 12/2014 | Hubbard et al. |
| 2014/0356983 A1 | 12/2014 | Lin et al. |
| 2015/0072444 A1 | 3/2015 | La Tulipe, Jr. et al. |

OTHER PUBLICATIONS

A. Young and S.J. Koester: "3D Process Technology Considerations", Chapter 2 in Integrated Circuits and Systems, A. Chandrakasan(ed). pp. 15-32 (2010).

(Continued)

*Primary Examiner* — David E Graybill
(74) *Attorney, Agent, or Firm* — Cantor Colburn LLP

(57) ABSTRACT

A bonding layer of a first wafer article is thermally treated and a bonding layer of a second wafer article is thermally treated in accordance with first and second process parameters, respectively prior to bonding the first wafer article with the second wafer article. First and second grid distortion in the first and second wafer articles is measured and a difference is determined between the first and second grid distortions. A prediction is made for maintaining the difference within a prescribed tolerance. At least one of the first process parameters and the second process parameters is conditionally varied in accordance with the prediction. The thermal treating of the first and second wafer articles can then be performed with respect to another pair of the first and second wafer articles prior to bonding to one another through their respective bonding layers.

5 Claims, 8 Drawing Sheets

(56) References Cited

OTHER PUBLICATIONS

J. Burns, et al., "A Wafer-Scale 3-D Circuit Integration Technology," IEEE Transactions on Electron Devices, vol. 53, No. 10, Oct. 2006, pp. 2507-2516.

Lee et al., "Wafer-to-Wafer Alignment for Three-Dimensional Integration: A Review", Journal of Microelectromechanical Systems, vol. 20, No. 4, Aug. 2011, pp. 885-898.

Matthias et al., "Thin wafer Processing—Yield Enhancement Through Integrated Metrology", Proc. 13th Electronic Packaging Technology Conference, pp. 113-116 (2011).

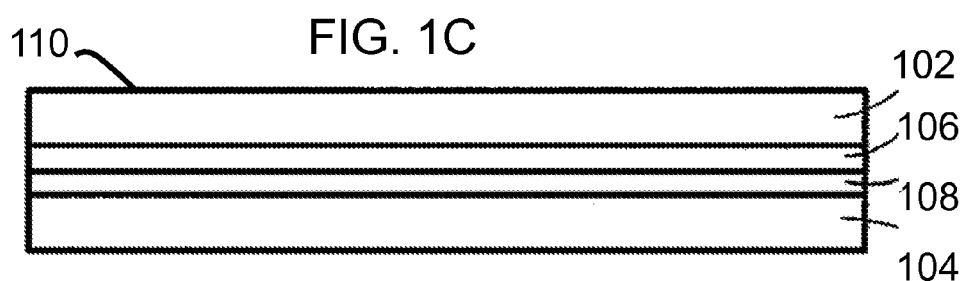
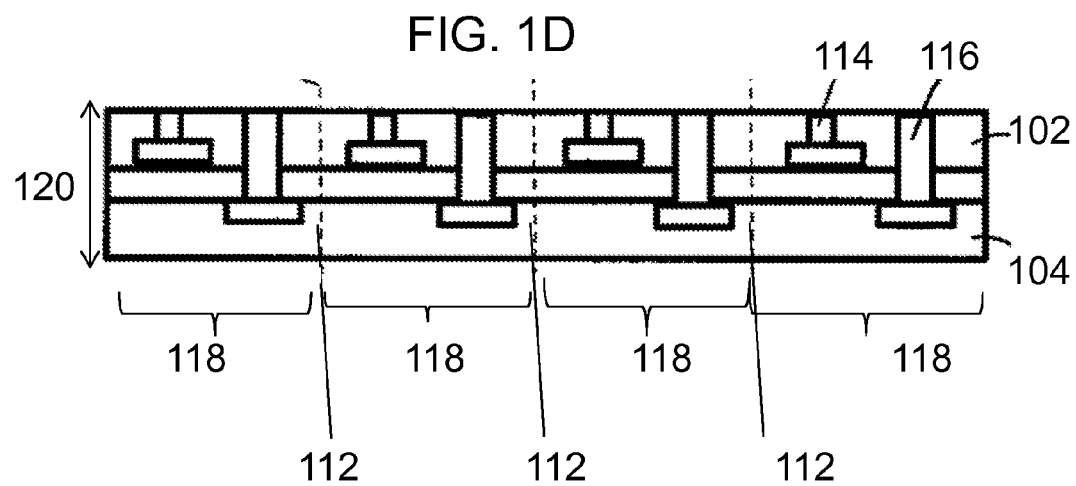

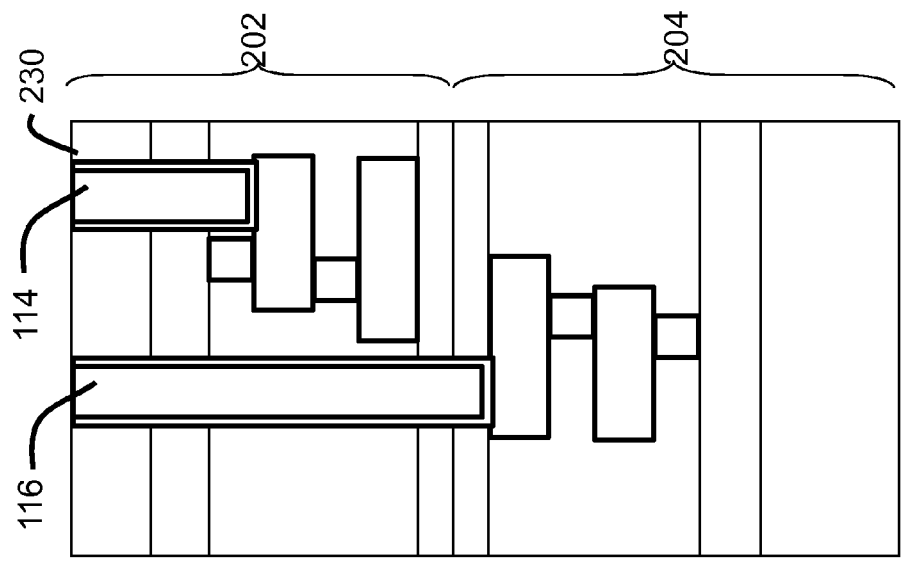
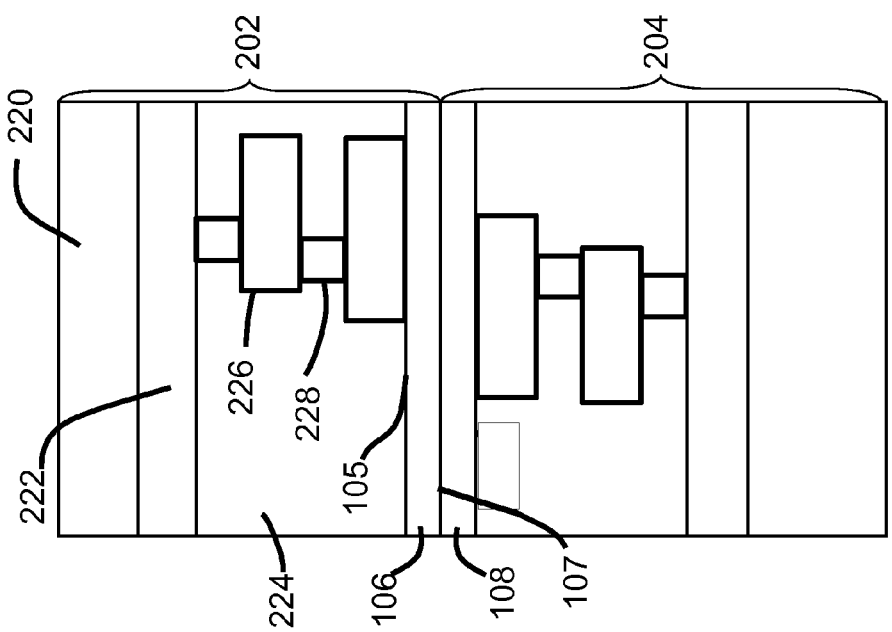
FIG. 2A
FIG. 2B

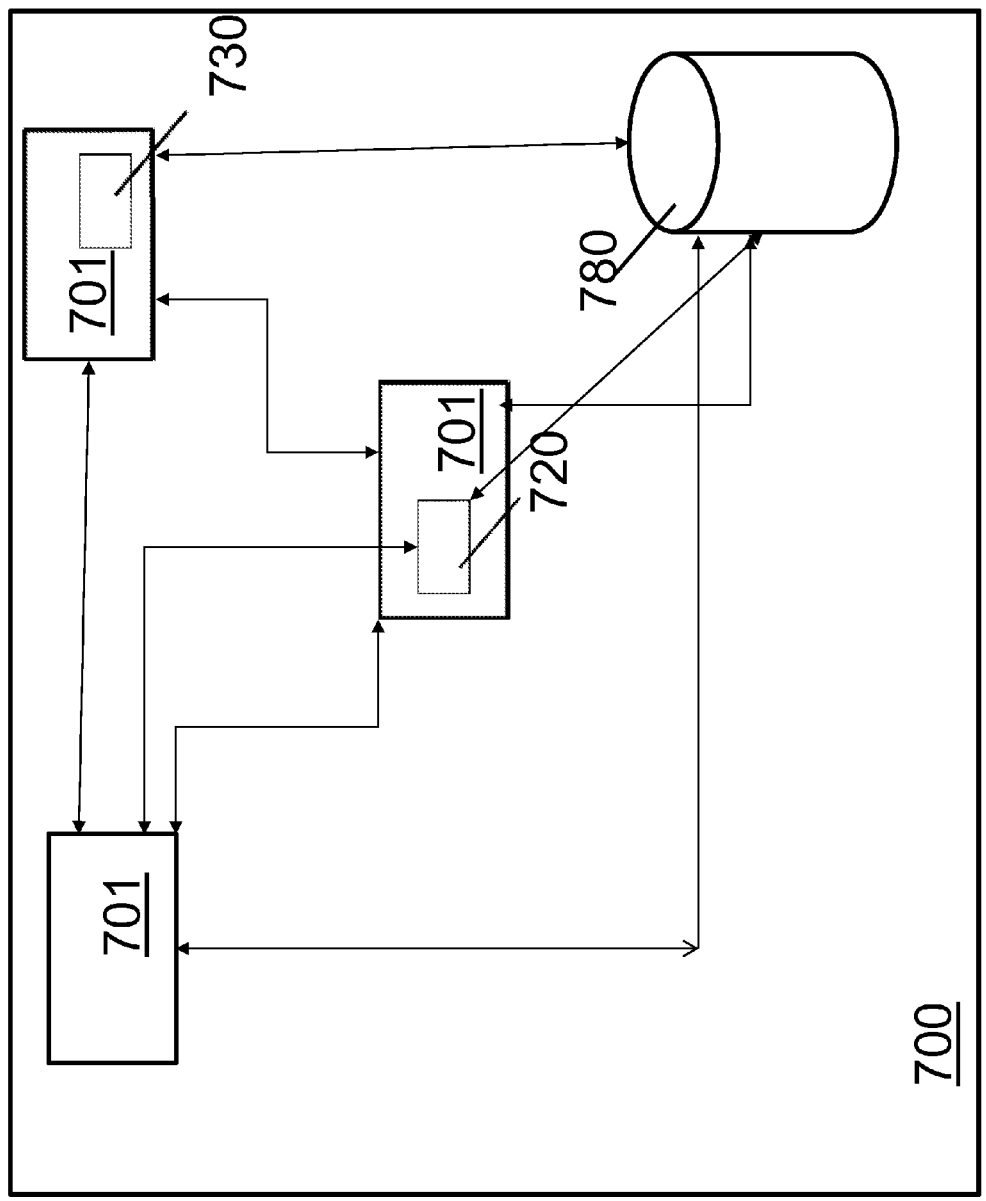

REDUCING WAFER BONDING MISALIGNMENT BY VARYING THERMAL TREATMENT PRIOR TO BONDING

DOMESTIC PRIORITY

This application is a divisional of U.S. patent application Ser. No. 14/019,637, filed Sep. 6, 2013, the disclosure of which is incorporated by reference herein in its entirety.

BACKGROUND

The present disclosure relates generally to microelectronic packaging, three-dimensional integration (3Di), and more specifically to fabrication of stacked semiconductor chip assemblies including bonding of first and second wafer articles to one another through bonding layers provided at respective surfaces thereof.

In the fabrication of stacked semiconductor chip assemblies, it can be advantageous to bond first and second wafers to one another through bonding layers provided at the respective surfaces of each wafer to form a wafer-level stacked assembly. Through silicon vias can provide vertical interconnects between conductive features of each wafer such as landing pads, traces, conductive pads or posts or traces and conductive features such as bond pads at one or more surfaces of the wafer-level assembly. Portions of the wafer-level assembly containing laterally adjacent semiconductor chips can then be severed from one another along saw lanes or "scribe lines" between the portions so as to form a plurality of assemblies each containing a plurality of vertically stacked chips.

BRIEF SUMMARY

A bonding layer of the first wafer article is thermally treated and a bonding layer of a second wafer article is thermally treated in accordance with first and second process parameters, respectively prior to bonding the first wafer article with the second wafer article. First and second grid distortion in the first and second wafer articles is measured, and a difference is determined between the first and second grid distortions. A prediction is made for maintaining the difference within a prescribed tolerance. At least one of the first process parameters and the second process parameters can be conditionally varied in accordance with the prediction. The thermally treating of the first wafer article and the thermally treating of the second wafer article can then be performed with respect to another pair of the first and second wafer articles prior to bonding the another pair of wafer articles to one another through their respective bonding layers.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the disclosure are apparent from the following detailed description taken in conjunction with the accompanying drawings in which:

FIGS. 1A-1D illustrate stages in a method of forming a bonded assembly in accordance with an embodiment of the invention;

FIG. 2A illustrate an exemplary bonded assembly;

FIG. 2B is a side cross-section depicting an exemplary bonded assembly having through silicon via interconnects, and showing an area of one connection between first and second wafer articles;

FIG. 7 is an illustration of a system environment according to an embodiment of the invention.

DETAILED DESCRIPTION

Embodiments of the invention are directed to improvements in assembling first and second wafer articles to one another through respective bonding layers on each of the first and second wafer articles.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIGS. 1A-1D illustrate stages in a method according to an embodiment of the invention in which first and second wafer articles are bonded to one another to form a stacked bonded assembly of wafer articles.

Figure 1A:
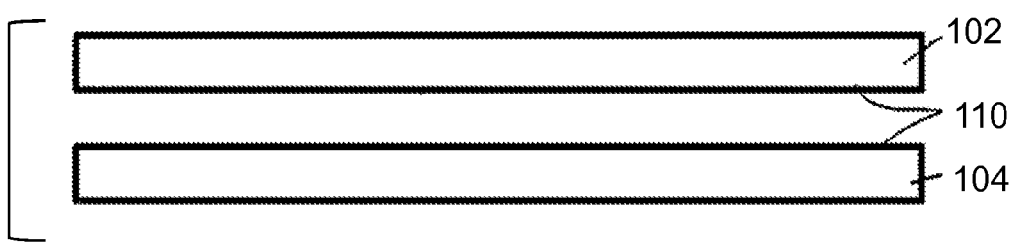

FIG. 1A illustrates an initial stage of wafer preparation, in which first and second wafer articles 102, 104 are provided. In one example, each wafer article may be a semiconductor wafer containing a plurality of semiconductor chips or may be a portion of a semiconductor wafer that contains one or more semiconductor chips. Thus, in one example, a "wafer article" can be a single chip, or can be an integral wafer or integral portion of a semiconductor wafer that includes multiple semiconductor chips still connected with one another at dicing lanes of such wafer or wafer portion. In a particular example, one or more of the wafer articles can be a reconstituted wafer or portion of a reconstituted wafer which contains a plurality of semiconductor chips spaced apart from one another in directions parallel to a face 110 of the reconstituted wafer, such semiconductor chips being bound together at edges thereof with a material such as an overmold material or epoxy. In particular examples, one or more of the wafer articles can contain two or more wafers or portions of wafers which are stacked and bonded to one another. In particular examples, one or more of the wafer articles can contain a first active semiconductor region at a first level of the wafer article and a second active semiconductor region at a second level of such wafer article overlying the first level.

Figure 1B:
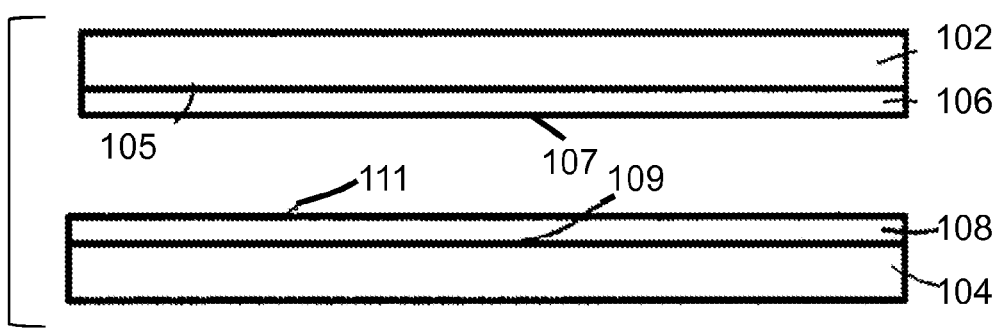

Referring to FIG. 1B, prior to bonding the first and second wafer articles to one another a bonding layer 106, 108 is prepared on each of the first and second wafer articles 102, 104. In particular examples, the bonding layer can be or can include an oxide, such as an oxide of silicon. In one example, the bonding layers 106, 108 can be formed by a low temperature chemical vapor deposition ("CVD") such as from a TEOS (tetraethylorthosilicate) precursor material. In some cases, as seen with wafer article 102, the oxide deposition used to form the bonding layer can have a gap-filling characteristic and a tendency for self-planarization of the surface 107 which faces away from the surface 105 of the original wafer article 102, which self-planarization may occur during the deposition, after the deposition such as during post-deposition baking, for example, or to some extent both during and after the deposition. In such cases, the exposed surface 107 of the bonding layer may be sufficiently planar as formed. In other cases, the bonding layer as deposited may conform to contours of the underlying topography of the wafer article, and then may undergo one or more further planarization processes to planarize the exposed surface 111 of a bonding layer, e.g., bonding layer 108 as illustrated for example in FIG. 1B, such as by one or more of processing with an abrasive, e.g., polishing or chemical mechanical polishing, etching or "wet clean processes", thermal treatments however performed, e.g., baking, rapid thermal processing, transfer of heat from a solid, liquid or gaseous medium, application of ultrasonic energy, e.g., for densifying or otherwise altering a characteristic of the bonding layer.

In other examples, the bonding layers 106, 108 can be or can include a polymeric material such as an adhesive material, which can be applied by a variety of ways. For example, a polymeric material such as polyimide, polyamide, photoresist, benzocyclobutane ("BCB") or other suitable adhesive material can be deposited to exposed surfaces 105, 109 of the wafer articles 102, 104 by spin-on techniques or spray-on techniques, which adhesive material may also self-planarize during deposition. Some photoresists have properties similar to a material such as BCB in that areas of the photoresist exposed to radiation remain while unexposed areas are removed when the photoresist image is developed. Such materials can also be patterned to permit access to conductive features of the wafer articles, as will be described further below.

In still other examples, the bonding layer of each wafer article can be a patterned metal layer that has been patterned into a plurality of individual metal features so as to provide mechanical and electrical coupling between the wafer articles either by direct bonding of the metal features to one another or using a bond metal, e.g., solder, tin, copper or suitable metal to bond the metal layers to one another. The metal features may include metal pads, pillars, studs, or other structure, for example. Such metal features can include metal features electrically coupled to the metal features of the underlying wafer, or may include metal features which are not electrically coupled to the metal features of the underlying wafer.

In yet another example, a bonding layer can be formed on a wafer article which includes elements of both an oxide layer and patterned metal features, both of which are exposed at a surface 107 of a bonding layer 106 of a first wafer article 102 and which are mated with corresponding patterned metal features and an oxide layer of the other bonding layer 108 of a second wafer article 104.

FIG. 1C shows the first and second wafer articles 102 and 104 stacked and bonded with one another through the bonding layers 106, 108 provided on each wafer article to form a bonded assembly 110. A further thermal treatment may then be applied to the bonded assembly to lock the structure before proceeding. FIG. 1D further shows a stacked assembly of the first and second wafer articles 102, 104 in another stage of processing in which through silicon vias ("TSVs") 114, 116 extend through at least a portion of a thickness 120 of a chip-sized region 118 of the assembly 110. In one example, the structure of FIG. 1D can have a structure as further illustrated in FIGS. 2A-2B, in which a first wafer article such as a semiconductor wafer 202 is shown having an active semiconductor region in a monocrystalline semiconductor region 220 and a "front end of line" ("FEOL") region 222 which can include associated structure such as transistor gates, first contacts to active semiconductor region and in some examples, a lowest level or "M0" interconnection within transistors or between transistors in the structure. Typically, the wafer article includes a "back end of line" ("BEOL") interconnection structure overlying the FEOL layer 222 which can include a dielectric region 224 and patterned metal features such as wiring lines, e.g., wiring lines 226, and vias 228 providing vertical interconnection between wiring lines 226. FIG. 2A illustrates the location of the bonding layer 106 having a surface 105 facing the dielectric region 224 and another surface 107 facing away from the dielectric region 224 and bonded to a corresponding bonding layer 108 of a second wafer article 204.

FIG. 2B illustrates a stage of fabrication after through silicon vias ("TSVs") 114, 116 have been formed to provide electrical connection between connection points of chips within the bonded assembly 210 and a connection interface thereto which may be provided through terminals (not shown) which are coupled to the TSVs at or above surface 230 towards which the TSVs extend. Typically after forming the TSVs, the bonded assembly 210 is severed into individual assemblies each typically including a chip from wafer article 202, and another chip from wafer article 204 or it can continue with additional wafer stacking, with individual chip stacks diced at the end of the multi-stacking process. Wiring provided at or above surface 230 can be used to electrically interconnect TSVs 114, 116 that are coupled to the chips severed from the respective wafer articles 202, 204. It should be noted that some of the TSVs may be already formed and buried in the substrates and then revealed later.

As illustrated in FIG. 2A, in one example, the second wafer article 204 can have a structure similar or essentially identical to that of the first wafer article 202. Alternatively, as stated above, one or both of the first and second wafer articles may include more than one active semiconductor region at more than one vertically stacked level of such wafer article.

Wafer to wafer bonding can be used to make chip-sized vertically stacked interconnected assemblies of semiconductor chips. Such vertically stacked chip-sized assemblies can increase circuit density relative to an area of a circuit board to which the assembly will be coupled, as the number of circuits in each vertically stacked assembly is typically equal to the number of circuits in each chip multiplied by the number of chips in the vertically stacked assembly. Such assemblies can be advantageously employed in mobile devices, e.g., multipurpose mobile computing devices such as smartphones, tablet computers, among others. One of the challenges today is to further increase integrated circuit density of the chips that will be stacked in such stacked assemblies, as the number of transistors on a single chip increases and the number of external electrical interconnections to external contacts of a single chip also increases. However, increase in circuit density of each chip tends to decrease the size of each contact of the chip as well as the spacing between adjacent contacts of the chip.

Figure 3B:
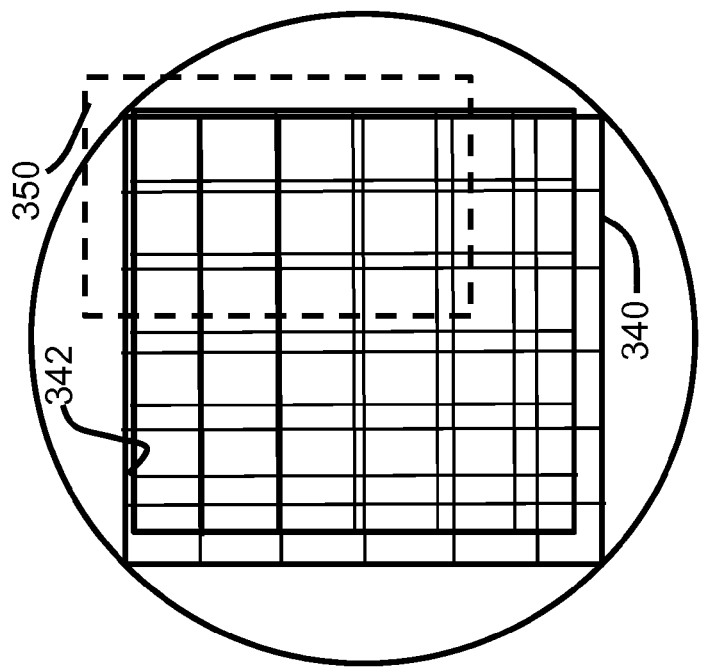
FIGS. 3A and 3B illustrate examples of relative misalignment and differences in extent of distortion between grids of respective wafer articles.
Figure 3A:
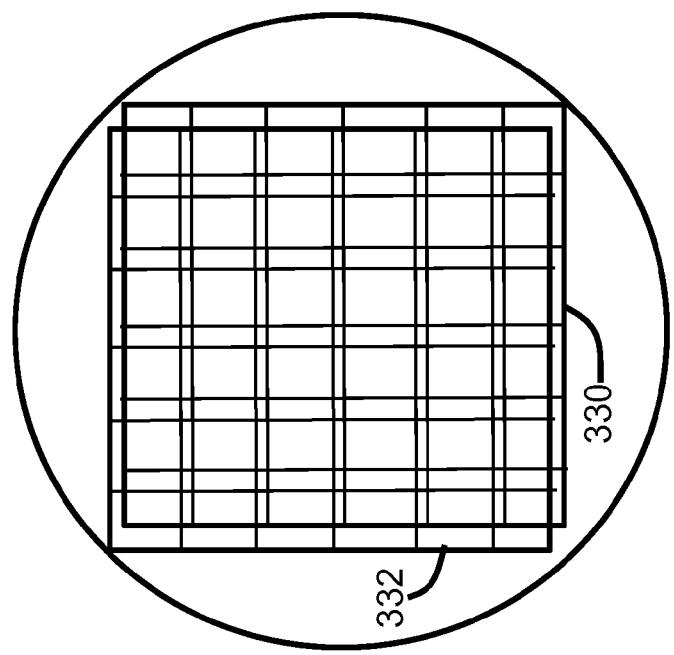

As number of contacts on each chip increases and the size of each contact and the spacing between each contact chip decreases, it can become more challenging to fabricate wafer level assemblies. When bonding first and second wafer articles together, great care must be taken that the contacts or other metal features of each wafer article are aligned within prescribed tolerances of corresponding contacts or metal features of another wafer article. This process is particularly challenging for prevalent 300 millimeter size wafers because of the large wafer size and the fact that both the size of the contacts and the spacing between adjacent contacts on each wafer can be smaller than in previous generations. FIGS. 3A and 3B further illustrate one of the difficulties of wafer to wafer bonding due to variations in the extent to which grid distortion occurs in each wafer article 102, 104 prior to bonding the wafer articles together. As used herein, "grid distortion" means relative variation in the planar positions of locating features within an expected "grid" or layout of electrically conductive contacts with respect to expected ideal horizontal positions of the locating features, where "planar" means in directions parallel to a plane defined by a surface of the wafer article. Grid distortion tends to arise during formation of the BEOL wiring patterns and during formation of a bonding layer and its subsequent a thermal treatment, if any. Grid distortion tends to vary from one batch of wafer articles to another batch of wafer articles due to conditions under which each batch of wafer articles has been processed. Grid distortion can also vary from one wafer article to another within a particular batch of wafer articles.

Grid distortion can be further explained with reference to FIGS. 3A and 3B. In FIG. 3A, the layout of metal contacts and metal features on a first wafer article after formation of a bonding layer and subsequent thermal treatment thereof is depicted by grid 330, and the layout of locating features on a second wafer article after formation of a bonding layer on the second wafer article and subsequent thermal treatment thereof is depicted by grid 332. In the example seen in FIG. 3A, although there is misalignment between the locating features of the grids 330, 332 of the respective wafer articles, there is relatively little difference in grid distortion between the two grids, as any expansion or shrinking of the size or spacing of the features of one grid 330 relative to the other grid 332 is within a prescribed tolerance and is manageable, so long as the grids 330, 332 of the wafer articles are properly aligned together prior to bonding.

However, FIG. 3B shows a different case in which the size and spacing of the contacts and metal features of the grid 340 of one wafer article are expanded relative to the size and spacing of the contacts and metal features of the grid 342 of another wafer article to be bonded thereto. The extent of the expansion is greater exaggerated for purposes of illustration and explanation. In this case, the expansion of the grid 340 of one wafer article relative to the grid 342 of the other wafer article mean that best case alignment can be achieved only for certain portions of the wafer articles, e.g., area 350 where the grids of the two wafer articles can be aligned within a prescribed tolerance, e.g., within prescribed tolerances in X and Y orthogonal horizontal directions. In this case, even with improved alignment between the grids 340, 342 of the two wafer articles, a further improvement may be needed to fully address the difference in grid distortion between the two wafer articles.

Figure 4:
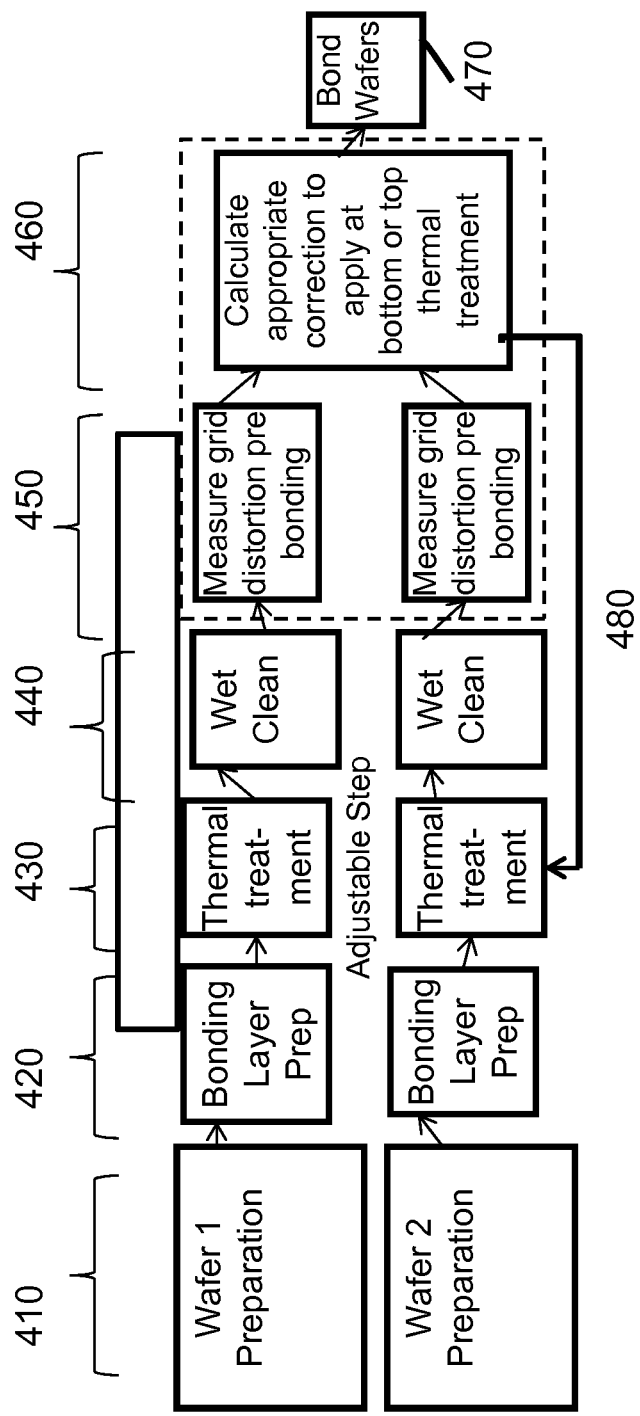
FIG. 4 illustrates a process flow in accordance with an embodiment of the invention.

Turning now to FIG. 4, a method is illustrated therein which can be used to address a difference between grid distortion of first and second wafer articles in a manufacturing line used to conduct wafer to wafer bonding of respective pairs of such first and second wafer articles. As referenced in FIGS. 4, 5 and 6 as "wafer" and "wafers" these words will be given the meaning ascribed herein to "wafer article" and "wafer articles".

As seen in FIG. 4, prior to being bonded to one another (at 470), each of a first wafer article and a second wafer article can be processed in stages including the preparation (410) of the wafer articles themselves ("Wafer 1" and "Wafer 2") through fabrication of the BEOL and possibly other electrically conductive structure, the preparation of a bonding layer (420) as described above, after which the bonding layer of a first wafer article may be thermally treated and the second wafer article may be optionally thermally treated (430) as described above, and then followed by an optional wet clean or planarization processing (440). The thermal treatment can help to stabilize the bonding layer applied to a wafer article prior to bonding, or may reduce an amount of time needed to prepare the bonding layer, (e.g. so as to partially cure the bonding layer, prior to bonding the wafer articles). Then, at this stage of processing (450) the grid distortion in each of the wafer articles is measured. As further shown in FIG. 4, an appropriate correction is calculated (460) for applying to the bottom or top thermal treatment of upstream wafer articles in the line is shown at 430, and then the first and second wafer articles are bonded to one another, as shown at 470.

The correction calculated at 460 can be applied to the thermal treatment of wafer articles which are upstream relative to the ones on which the grid distortion measurements are made at 450. In one example, the correction can be calculated by determining between the first and second grid distortions, i.e., the grid distortions in the first and second wafer articles, and determining a prediction for maintaining the difference in the first and second grid distortions within a prescribed tolerance. As further shown at 480 in FIG. 4, the prediction then is provided as feedback to the upstream thermal treatment processing stage where such prediction is applied to a further pair of first and second wafer articles to conditionally vary at least one of the thermal treatment of the first wafer article (Wafer 1) or to conditionally vary the optional thermal treatment of the second wafer article (Wafer 2) in order to reduce a difference in the grid distortions that will be measured in the subsequent measurement stage 450. As used herein, "varying" of process parameters means adjusting one or more of such process parameters to another value which can range from no application of a particular aspect of the treatment (e.g. such as heating, illumination and the like) to another controlled setting. In this process, the correction to the thermal treatment or optional thermal treatment step can be referred to as a "prediction" because the final results of making the correction typically will not be known until a later point in time at which a further pair of wafer articles to which the correction is applied have been fully processed and measured at stage 450.

As the prediction may only sometimes call for a change in the thermal treatment of the upstream wafer articles, the varying of the thermal treatment is done conditionally in accordance with the prediction. Therefore, one or more of temperature, heating time or illumination settings are set differently when the prediction calls for a change in the thermal treatment in order to reduce the difference in grid distortion between the bonding layers of the wafer articles to be bonded together. Conversely, the prediction may not call for varying the thermal treatment of the upstream wafer articles when the grid distortion measurements are sufficiently close, and in such case the thermal treatment may not be varied on account of such prediction.

Figure 5:
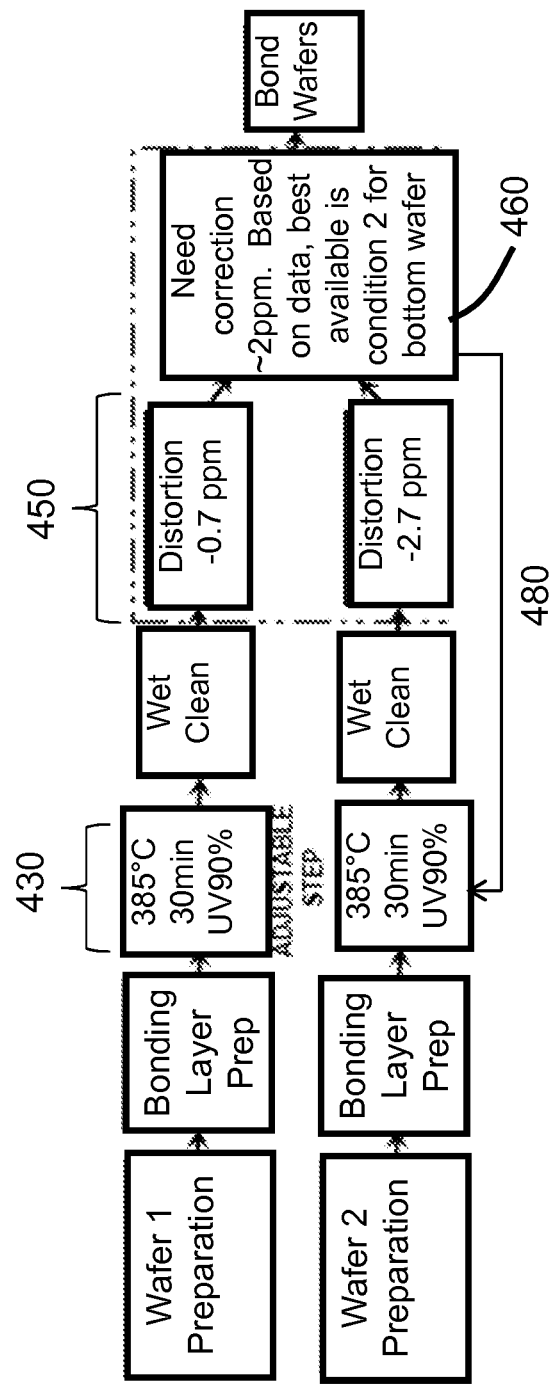
FIG. 5 illustrates showing application of a process flow according to an embodiment of the invention to a particular example.
Figure 6:
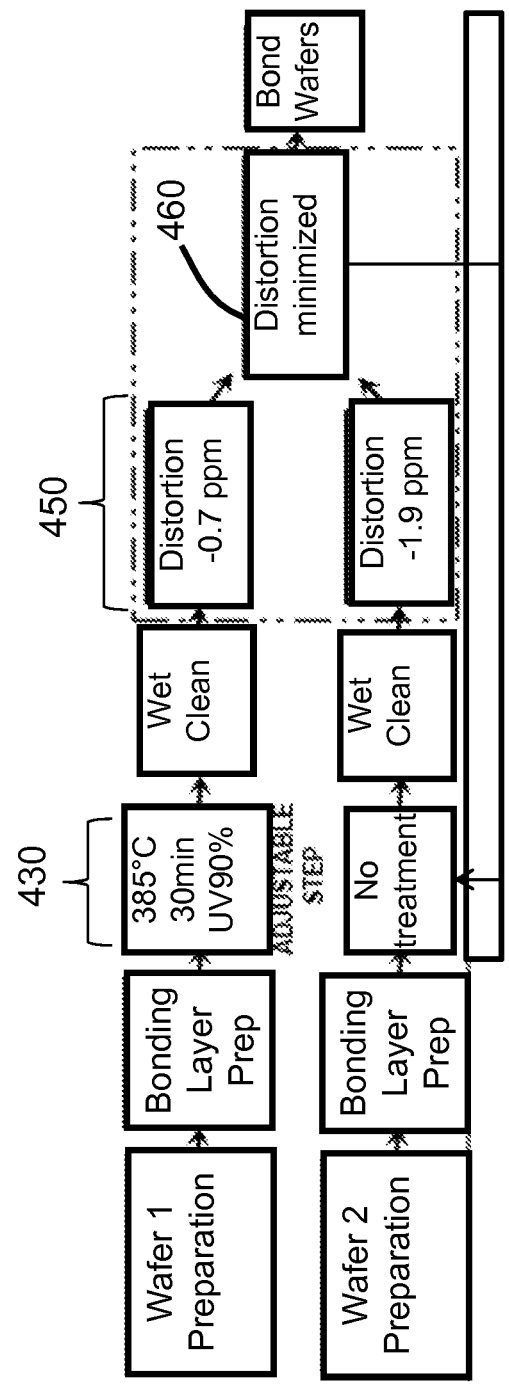
FIG. 6 further illustrates application of a process flow according to an embodiment of the invention to a particular example.

FIGS. 5 and 6 illustrate a specific example of use of a method as described above relative to FIG. 4. FIG. 5 shows an example in which both wafer articles are thermally treated (at 430) under the same process parameters of temperature=385° C., heating time 30 minutes and ultraviolet radiation of a predetermined wavelength at 90% of maximum intensity. Measurements of the grid distortion (at 450) in the first and second wafer articles are −0.7 parts per million ("ppm") and −2.7 ppm, respectively. Accordingly, at stage 460, it is determined that the grid distortion of the second wafer article needs to be corrected by an amount of +2 ppm. A prediction is made that there is a specific set of process parameters for conducting the thermal treatment of the first wafer article and the optional thermal treatment of the second wafer article that will reduce the relative grid distortion between the first and second wafer article within a prescribed tolerance.

As further shown in FIG. 6, it is seen that the prediction for reducing the first and second grid distortions to within the tolerance calls for keeping the same process parameters as before for thermally treating the first wafer article at stage 430, i.e., same process conditions of temperature=385° C., heating time 30 minutes and ultraviolet radiation of a predetermined wavelength at 90% of maximum intensity, but that no thermal treatment should be applied to the second wafer article. As further seen in FIG. 6, now the grid distortion in the second wafer article of the further pair of wafer articles is reduced to −1.9 ppm, which is much closer to the grid distortion in the first wafer article of the further pair of wafer articles which, like the previous first wafer article, is also measured at −0.7 ppm. In this way, the measurement of grid distortion and determination of a prediction for correcting the difference in grid distortion and its application as feedback for the processing of upstream wafer articles in the line can help to reduce the relative difference in grid distortion between wafer articles in manufacturing and improve throughput and the quality of bonded wafer assemblies made in this way.

FIG. 7 is a block diagram illustration of a computing environment as per one embodiment of the present invention having a facilitated network system 700. As illustrated in FIG. 7, the system comprises a plurality of nodes 701 that are in processing communication with one another. This communication can be enabled through wired or wireless processing or other alternate means as can be appreciated by those skilled in the art. Each node 701 can also include one or more processors 730. Each node 701 can include its own internal memory as shown at 720, or be in processing communication with that node's internal memories, or in communication with one or more external memories such as the one shown in FIG. 7 at 780. The system memories 720 and 780 can also be in communication directly with one another or through the node and either be comprised of a single unit that is shared among the many nodes 701 or be comprised of a plurality of components that are in processing communication with one another. In this manner, each node 701 can either exclusively use a single memory or alternatively use multiple memories at the same time or at different times to achieve processing optimization.

In one embodiment, one or nodes 701 or processors 730 can be used while in processing communication with one another one of the memories such as 720 or 780 to provide instructions for carrying out the techniques discussed above. The memory can have a set of instructions recorded thereon which can be carried out by the processor to cause the thermal treatments of the boding layer of a first wafer article in accordance with first process parameters, and optional thermal treatment of the bonding layer of a second wafer article in accordance with second process parameters. The processor and memory can also be used to determine the grid distortion adjustments and difference predictions as discussed above. This is so that the conditional varying of the parameters and final thermal treatments with respect to another pair of the first and second wafer articles after the conditionally varying of the process parameters can be conducted as previously discussed to enable the bonding of the another pair of wafer articles to one another through their respective bonding layers.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

Further, as will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A system for bonding a first wafer article with a second wafer article, comprising:
   a processor; and
   a memory having a set of instructions recorded thereon which can be carried out by the processor to cause:
   thermally treating a bonding layer of a first wafer article in accordance with first process parameters, and thermally treating a bonding layer of a second wafer article in accordance with second process parameters;
   measuring first and second grid distortion in the first and second wafer articles, respectively, determining a difference between the first and second grid distortions and determining a prediction for maintaining the difference within a prescribed tolerance;
   conditionally varying at least one of the first process parameters and the second process parameters in accordance with the prediction;
   performing the thermally treating of the first wafer article and the thermally treating of the second wafer article with respect to another pair of the first and second wafer articles after the conditionally varying of the process parameters; and
   bonding the another pair of wafer articles to one another through their respective bonding layers.

2. The system of claim 1, wherein the conditionally varying of the process parameters includes omitting the thermal treatment of the bonding layer of the second wafer article.

3. The system of claim 1, wherein each of the first process parameters and the second process parameters include parameters for illumination, temperature and heating time and the conditionally varying varies a parameter selected from at least one of: the illumination, the temperature and the heating time of at least one of the first process parameters or of the second process parameters.

4. The system of claim 1, wherein in addition the instructions can be carried out by the processor to perform with respect to the another pair of wafer articles:
   repeating the measuring of the first and second grid distortion, determining the difference and determining the prediction for reducing the difference, and with respect to a further pair of the wafer articles repeating the conditionally varying of the process parameters, and the thermally treating of the first wafer and the thermally treating of the second wafer of the further pair of wafer articles after the conditionally varying of the process parameters, and
   repeating the additionally performing with respect to each such further pair of wafer articles and each such pair of wafer articles following the further pair of wafer articles.

5. The system of claim 1, wherein the first wafer article includes a first active semiconductor device region disposed at a first level of the first wafer article and a second active semiconductor device region disposed at a second level of the first wafer article separated from the first level of the first wafer article in a vertical direction.

* * * * *